(12) United States Patent
Zhang

(10) Patent No.: US 7,588,457 B2
(45) Date of Patent: Sep. 15, 2009

(54) ELECTRICAL CONNECTOR HAVING IMPROVED INDICATING MODULE

(75) Inventor: Hong-Bo Zhang, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/316,076

(22) Filed: Dec. 9, 2008

(65) Prior Publication Data
US 2009/0149061 A1    Jun. 11, 2009

(30) Foreign Application Priority Data
Dec. 6, 2007    (CN) .................... 2007 2 0131276 U

(51) Int. Cl.
*H01R 13/66*    (2006.01)
(52) U.S. Cl. .................... 439/490; 439/541.5
(58) Field of Classification Search ................ 439/490, 439/541.5, 607.26
See application file for complete search history.

(56) References Cited

U.S. PATENT DOCUMENTS

| 6,655,988 | B1 | 12/2003 | Simmons et al. | |
|---|---|---|---|---|
| 6,685,504 | B1 * | 2/2004 | Espenshade | 439/541.5 |
| 6,688,909 | B1 * | 2/2004 | Espenshade et al. | 439/490 |
| 6,699,065 | B1 * | 3/2004 | Espenshade et al. | 439/490 |
| 6,773,298 | B2 * | 8/2004 | Gutierrez et al. | 439/490 |
| 6,835,092 | B2 * | 12/2004 | Wan et al. | 439/541.5 |
| 6,957,982 | B1 * | 10/2005 | Hyland et al. | 439/620.05 |
| 2004/0224558 | A1 * | 11/2004 | Wan et al. | 439/541.5 |

* cited by examiner

*Primary Examiner*—Gary F. Paumen
(74) *Attorney, Agent, or Firm*—Wei Te Chung

(57) ABSTRACT

An electrical connector (1) has an insulative housing (3) having a number of channels (310), an indicating module (8) assembled to the insulative housing and an outer shield (7) enclosing the insulative housing. The indicating module includes a substrate (81) having a number of L-shaped slots (811) and an indicating assembly (82). The indicating assembly has a second printed circuit board (820), a number of LEDs (822) assembled on the second printed circuit board, and a number of L-shaped terminals (821) mounted into the L-shaped slots.

12 Claims, 4 Drawing Sheets

ELECTRICAL CONNECTOR HAVING IMPROVED INDICATING MODULE

BACKGROUND OF THE INVENTION

1. Field of the Invention

The present invention relates to an electrical connector, and particularly to an electrical connector having a plurality of indicating modules for stably monitoring the condition of the signals.

2. Description of the Prior Art

A conventional stacked modular jack mounted to a mother printed circuit board is disclosed in U.S. Pat. No. 6,655,988 issued on Dec. 2, 2003. The connector comprises an insulative housing having a plurality of slots, a plurality of light emitting diodes (LEDs) received in the slots and a plurality of LED modules mounted to the insulative housing. Each LED module includes a substrate having a plurality of passageways defined therein and a number of contacts assembled into the passageways. The contact has one end thereof in contact with the pins of LED, and another end thereof in electrical connection with the mother printed circuit board for electrically connecting the LED to the mother printed circuit board.

During assembly, the LED mounted into the slots of housing. The pins of LED connect with one end of the contact, another end of the contact connects with the mother printed circuit board. Therefore, the electrical connections between the pins of LEDs and the contacts are unstable.

Hence, an improved electrical connector is needed to solve the above problem.

BRIEF SUMMARY OF THE INVENTION

One object of the present invention is to provide an electrical connector having an improved indicating module for stably monitoring the condition of the signals.

The present invention provides an electrical connector mounted on a mother printed circuit board. The electrical connector comprises an insulative housing having a plurality of channels defined on a front portion thereof, an indicating module assembled to the insulative housing and an outer shield enclosing the insulative housing. The indicating module comprises a substrate having a plurality of L-shaped slots defined on a side surface thereof, an indicating assembly mounted to the substrate and a plurality of indicating pipes positioned within the channel. The indicating assembly has a second printed circuit board, a plurality of LEDs assembled on the second printed circuit board, and a plurality of corresponding L-shaped terminals mounted into the L-shaped slots of the substrate and electrically connected the second printed circuit board to the mother printed circuit board.

Advantages of the present invention are to provide an indicating module having a second printed circuit board connected the LEDs to the mother printed circuit board for stably monitoring the condition of the signals. Additionally, during assembly, the L-shaped terminals are directly mounted into the corresponding L-shaped slots for electrically connecting the second printed circuit board to the mother printed circuit board. That could result in simplifying the assembly of the indicating module.

Other objects, advantages and novel features of the invention will become more apparent from the following detailed description of the present embodiments when taken in conjunction with the accompanying drawings.

DETAILED DESCRIPTION OF THE INVENTION

Figure 1:
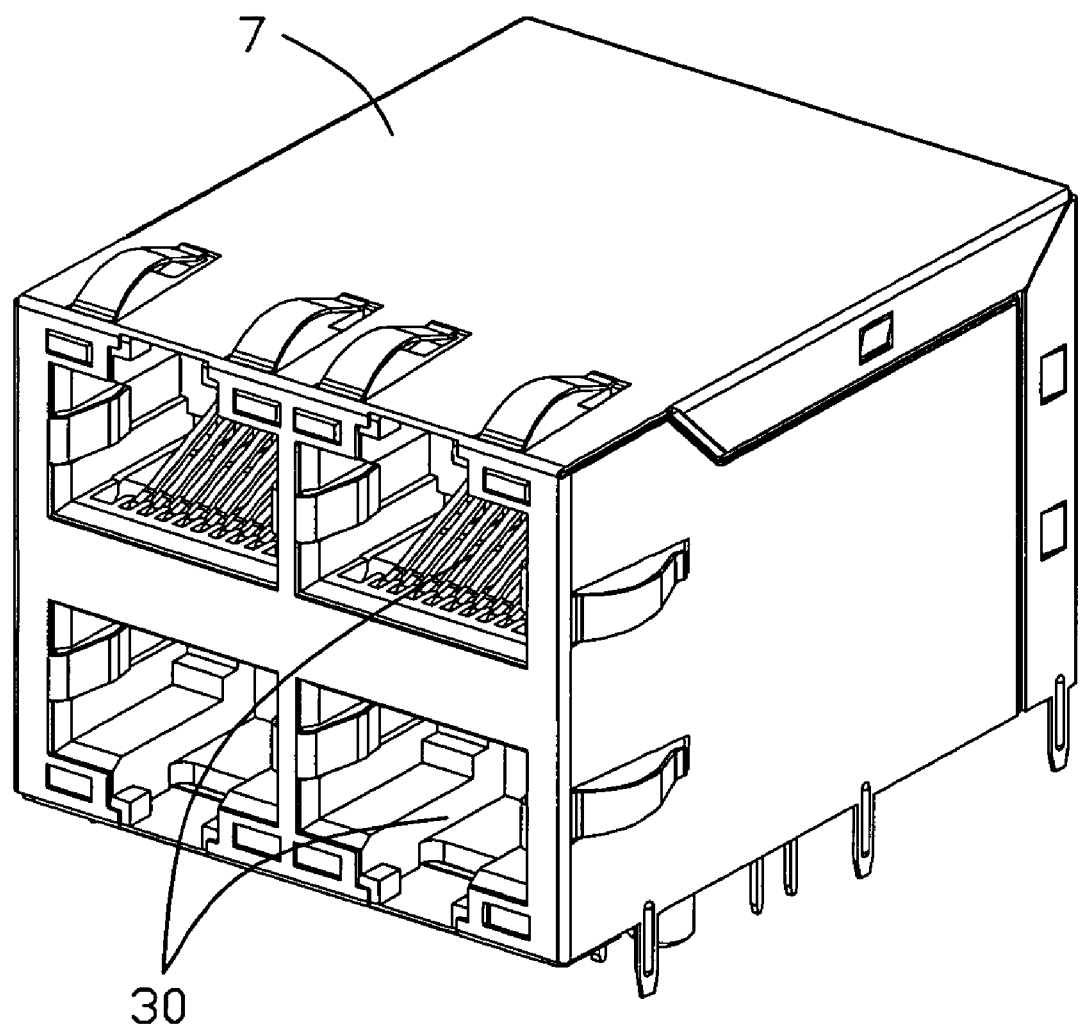
FIG. 1 is an assembled perspective view of an electrical connector according to the present invention.
Figure 3:
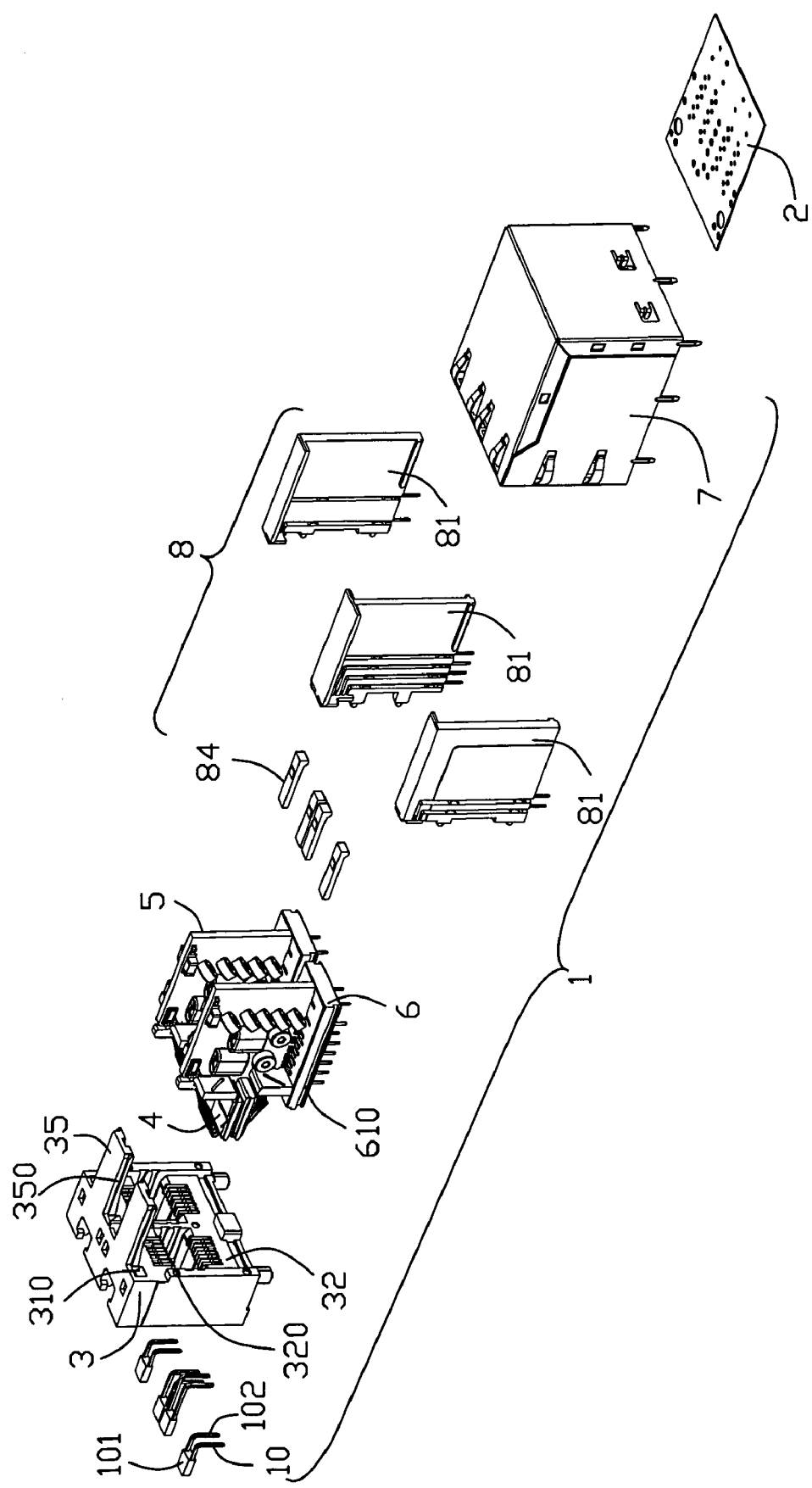
FIG. 3 is an exploded view of the electrical connector and a mother printed circuit board.

Reference will now be made to the drawing figures to describe the present invention in detail. Referring to FIGS. 1 and 3, a stacked electrical connector 1 for mounting onto a mother printed circuit board 2 in accordance with the present invention comprises an insulative housing 3 having two arrays of ports 30 for mating with a plurality of electrical plugs (not shown), a pair of daughter printed circuit boards 5 mounted to the insulating housing 3, a number of contacting modules 4 received in the ports 30, an indicating module 8 assembled to the insulative housing 3, a pair of connecting modules 6 connected the daughter printed circuit boards 5 to the mother printed circuit board 2 and an outer shield 7 enclosing the insulative housing 3.

Figure 2:
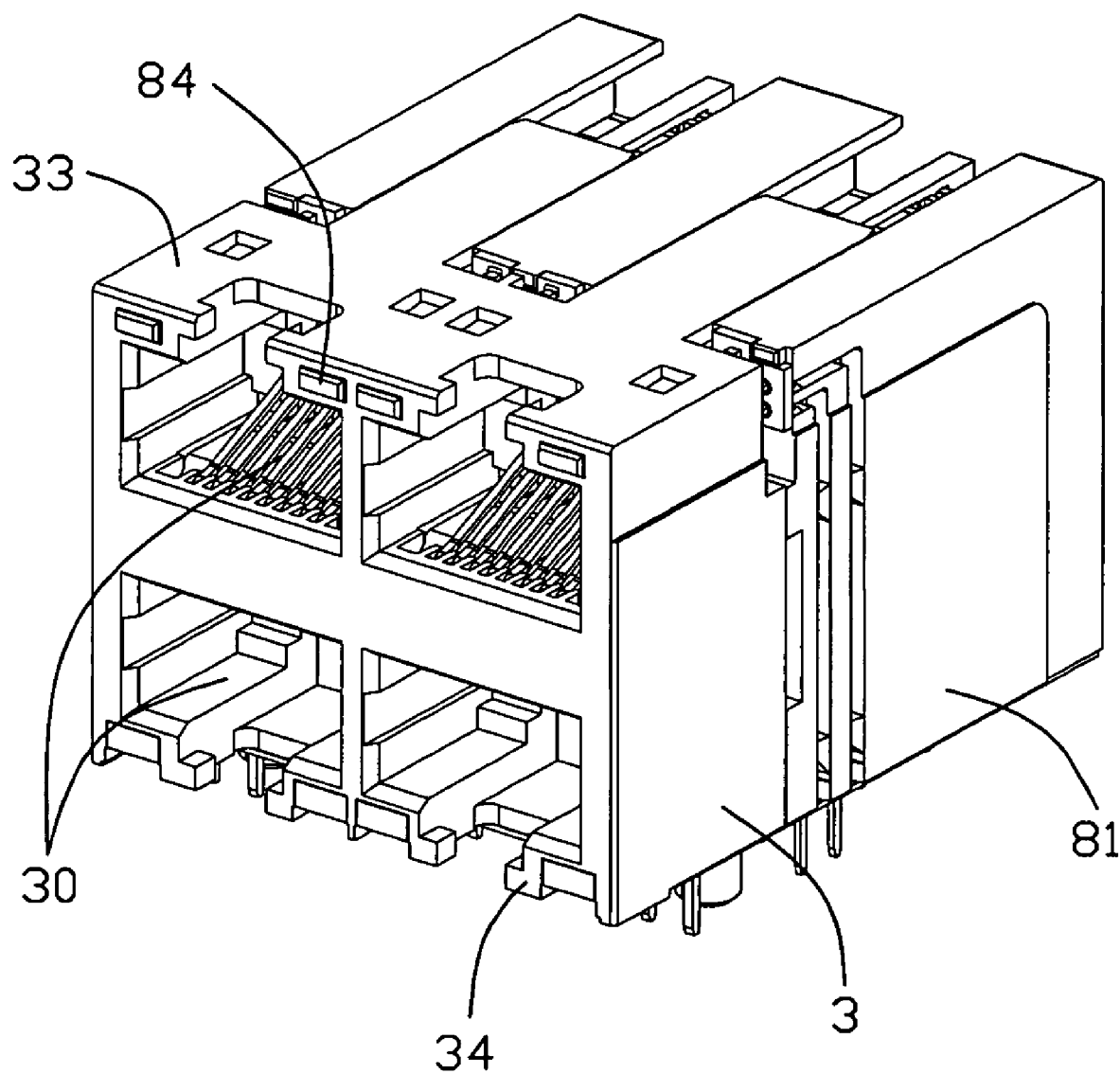
FIG. 2 is an assembly perspective view of the electrical connector as shown in FIG. 1, with an outer shield being removed.

As shown in FIGS. 2-3, the insulative housing 3 has a rear wall 32, a top wall 33 defining a plurality of channels 310 therein, a bottom wall 34 and a pair of projecting portions 35 extending rearwardly from the rear wall 32.

Figure 4:
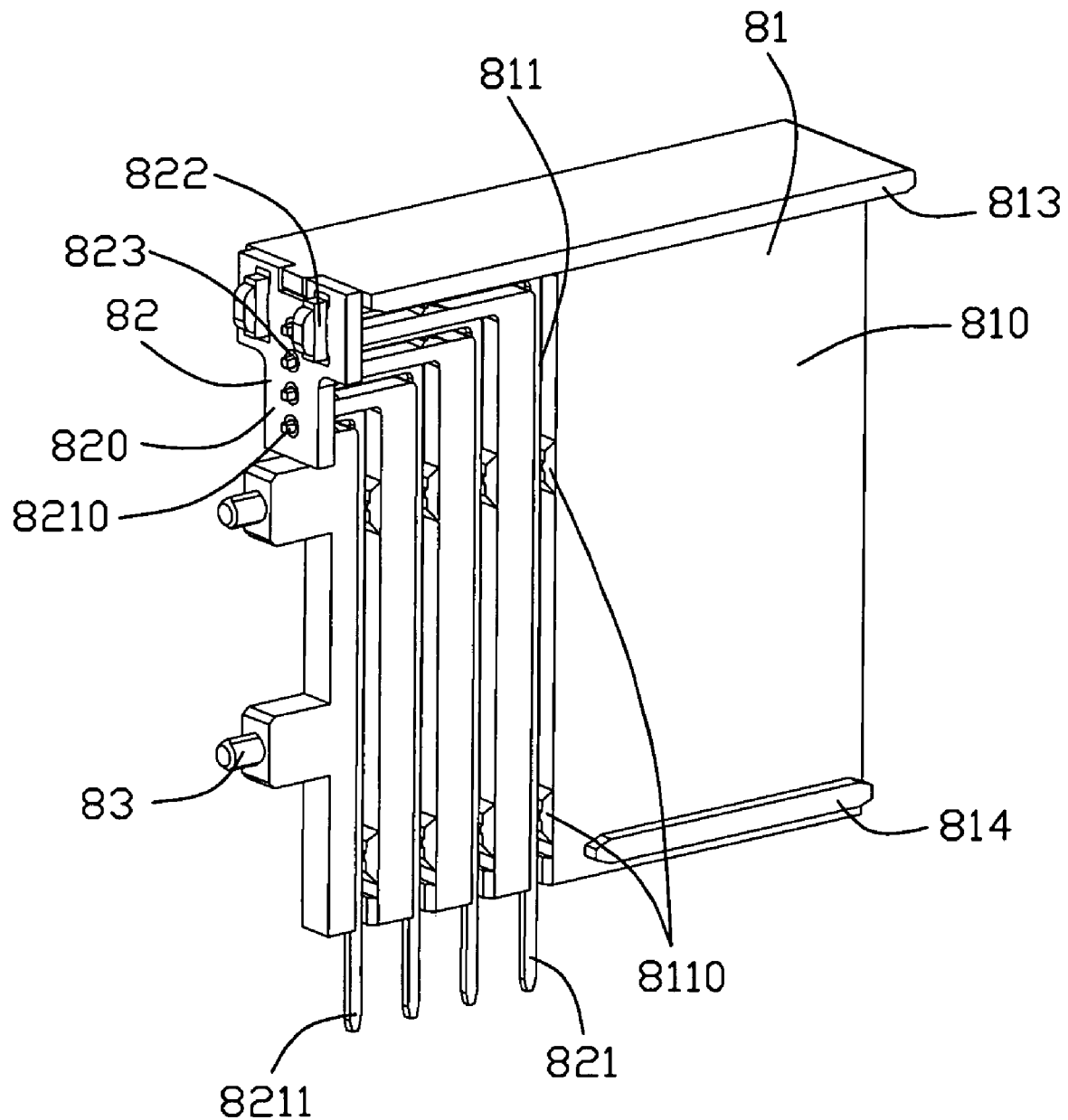
FIG. 4 is a perspective view of an indicating assembly mounted to a substrate as shown in FIG. 3.

Referring to FIGS. 3 and 4, the indicating module 8 has a plurality of substrates 81 each having a plurality of L-shaped slots 811 defined on a side surface 810 thereof, an indicating assembly 82 mounted to the substrate 81 and a plurality of indicating pipes 84 positioned within the channels 310 of insulative housing 3.

The substrate 81 has a plurality of posts 83 extending forwardly, for mating with a plurality of recesses 320 defined on the rear wall 32 of the insulative housing 3. The substrate 81 further has a protruding portion 813 on a top edge thereof for mating with a stepped portion 350 disposed on the side portion of the projecting portion 35.

The indicating assembly 82 comprises a second printed circuit board 820 having a number of holes 823, a plurality of LEDs 822 assembled on the second printed circuit board 820, and a plurality of L-shaped terminals 821 mounted into the L-shaped slots 811 of the substrate 81 and electrically connected the second printed circuit board 820 to the mother printed circuit board 2. The second printed circuit board 820 is assembled to a front portion of the substrate 81 and has a plurality of vias (not shown) for electrically connecting with the L-shaped terminals 821. Each L-shaped terminal 821 has a first contacting end 8210 extending though the hole 823 of the second printed circuit board 820 and a second contacting end 8211 extending downwardly from the substrate 81 for electrically connecting with the mother printed circuit board 2. The substrate 81 has a plurality of protrusions 8110 extending into the L-shaped slots 811 for firmly interfering with the L-shaped terminal 821.

The daughter printed circuit boards 5 are positioned in alignment with the substrates 81 and respectively has an aperture (not labeled) formed on a front portion thereof. The contacting module 4 is positioned into the aperture and mounted into the ports 30 of the insulative housing 3. The connecting module 6 is assembled to the bottom wall 34 and includes a second passageway 610 defined on a side portion thereof for coupling with a second protruding portion 814 disposed on a bottom edge of the side surface 810 of the substrate 81.

The electrical connector 1 further has a plurality of second LEDs 10 mounted to the bottom wall 34 of the insulative housing 3. The second LEDs 10 includes a number of pins 102 extending downwardly from the bottom wall 34 for connecting with the mother printed circuit board 2.

During assembly, firstly, the indicating pipes 84 are positioned within the channels 310 of insulative housing 3. Secondly, the L-shaped terminals 821 are mounted into the L-shaped slots 811 of the substrate 81 and inserted through the holes 823 of the second printed circuit board 820. Then the LEDs 822 are assembled onto the mother printed circuit board 2. Thirdly, the substrates 81 are mounted to the rear wall 32 of the insulative housing 3. The protruding portion 813 of the substrate 81 mates with the stepped portion 350 and the second protruding portion 814 engages with the second passageway 610 of the connecting module 6. The second LEDs 10 are mounted into the bottom wall 34 of insulative housing 3. Finally, the outer shield 7 encloses the insulative housing 3.

It is to be understood, however, that even though numerous characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. An electrical connector for mounting on a mother printed circuit board, comprising:
    an insulative housing having a plurality of channels;
    an indicating module assembled to the insulative housing and comprising:
        a substrate having a plurality of L-shaped slots defined on a side surface thereof;
        an indicating assembly mounted to the substrate and comprising a second printed circuit board, a plurality of light emitting diodes (LEDs) assembled on the second printed circuit board, and a plurality of L-shaped terminals mounted into the L-shaped slots of the substrate and electrically connecting the second printed circuit board to the mother printed circuit board; and
        a plurality of indicating pipes received within the channels and positioned in alignment with the LEDs; and
    an outer shield enclosing the insulative housing.

2. The electrical connector as claimed in claim 1, wherein said substrate has a plurality of protrusions extending into the L-shaped slots for interfering with the L-shaped terminals.

3. The electrical connector as claimed in claim 1, wherein said second printed circuit board is assembled to a front portion of the substrate and has a plurality of vias for electrically connecting with the L-shaped terminals.

4. The electrical connector as claimed in claim 3, wherein each L-shaped terminal has a first contacting end extending through a hole defined on the second circuit board and a second contacting end extending downwardly beyond the substrate for electrically connecting with the mother printed circuit board.

5. The electrical connector as claimed in claim 1, wherein said substrate has a plurality of posts extending forwardly, and the insulative housing has a plurality of recesses mating with the posts.

6. The electrical connector as claimed in claim 1, wherein said insulative housing has a projecting portion extending rearwardly therefrom, and said substrate has a protruding portion coupling with the projecting portion.

7. The electrical connector as claimed in claim 1, wherein the insulative housing comprises two rows of ports for mating with a plurality of electrical plugs.

8. The electrical connector as claimed in claim 1, further comprising a plurality of daughter printed circuit boards mounted to the insulative housing, and wherein there are a plurality of substrates each positioned parallel to an adjacent daughter printed circuit board in an alternating relationship.

9. The electrical connector as claimed in claim 8, further comprising a plurality of contacting modules each positioned into an aperture formed on a front portion of a respective one of the daughter printed circuit boards and mounted into the port.

10. The electrical connector as claimed in claim 8, further comprising a connecting module assembled to a bottom portion of the daughter printed circuit board and connected to the mother printed circuit board.

11. The electrical connector as claimed in claim 10, wherein said connecting module comprises a passageway defined on a side portion thereof, and said substrate has a protruding portion on a bottom edge thereof for coupling with the second passageway.

12. An electrical connector comprising:
    an insulative housing;
    a plurality of terminal modules assembled to the housing for mounting to a mother board; and
    a plurality of indicating modules alternately arranged with the terminal modules, each of said indicating modules including a first substrate defining a plurality of slots receiving therein a plurality of terminals for connecting to the mother board, and a second substrate positioned in front of and perpendicular to the first substrate and connected to the terminals; wherein
    said second substrate is a printed circuit board and a plurality of LEDs are linked thereto under condition of said LEDs being exposed to a front face of the housing.

* * * * *